United States Patent [19]
Seto et al.

[11] Patent Number: 5,507,657
[45] Date of Patent: Apr. 16, 1996

[54] ELECTRICAL CONNECTOR COVER

[75] Inventors: Masashi Seto, Zama; Shinichi Aihara, Atsugi; Kouichi Inoue, Yokohama, all of Japan

[73] Assignee: Molex Incorporated, Lisle, Ill.

[21] Appl. No.: 311,468

[22] Filed: Sep. 23, 1994

[51] Int. Cl.⁶ .................................................. H01R 13/44
[52] U.S. Cl. ............................ 439/135; 439/940; 439/83
[58] Field of Search ................................. 439/68–73, 78, 439/83, 135, 136, 149, 940

[56] References Cited

U.S. PATENT DOCUMENTS

| | | | |
|---|---|---|---|
| 4,795,354 | 1/1989 | Owen | 439/137 |
| 5,026,295 | 6/1991 | Fong et al. | 439/135 |
| 5,055,971 | 10/1991 | Fudala et al. | 361/400 |
| 5,147,209 | 9/1992 | Litwin et al. | 439/70 |
| 5,249,977 | 10/1993 | Tanaka et al. | 439/135 |
| 5,277,601 | 1/1994 | Miyazawa | 439/135 |

OTHER PUBLICATIONS

Samtec Full LIne Catalog No. F–193–1, Aug. 1993 pp. 5, 6, 7, 67, 69 and 73.

*Primary Examiner*—Khiem Nguyen
*Attorney, Agent, or Firm*—Stephen Z. Weiss

[57] ABSTRACT

An electrical connector is adapted for mounting to a mounting surface of an electrical apparatus through the engagement of a vacuum-suction nozzle of a pick and place machine. The connector includes a dielectric housing having a first interface adapted to be positioned adjacent the mounting surface of the electrical apparatus, a second interface opposite the first interface and opposite side walls extending between the interfaces. A plurality of conductive terminals are mounted on the housing for interconnection to circuitry on the electrical apparatus. A removable cover is positionable on the housing over at least a portion of the second interface. The cover has a generally planar, smooth surface for engagement by the vacuum-suction nozzle. Slidable retention shoulders are provided between the cover and the side walls of the housing and are adapted to retain the cover on the housing with substantial force in a direction generally normal to the smooth surface of the cover. However, the slidable retention shoulders allow the cover to be mounted on and removed from the housing with minimal or zero force laterally of the normal direction.

8 Claims, 4 Drawing Sheets

ELECTRICAL CONNECTOR COVER

FIELD OF THE INVENTION

This invention generally relates to the art of electrical connectors and, particularly, to a cover for use in automatically mounting electrical connectors to a mounting surface of an electrical apparatus with the aid of a vacuum-suction nozzle.

BACKGROUND OF THE INVENTION

As is well known in the art, a soldering reflow system often is used in automatically mounting electrical connectors to appropriate electrical apparatus, such as printed circuit boards. Specifically, an electrical connector is secured by a vacuum-suction nozzle of a pick and place machine, and the connector is adjusted in position and brought to a selected location on a printed circuit board, for instance, by the vacuum-suction nozzle. The connector then is released from the nozzle by stopping application of negative pressure thereto. Then, the soldering reflow system is employed to solder appropriate terminals of the connector to selected circuit traces on the printed circuit board.

Some electrical connectors are provided with a generally planar, smooth top surface for engagement by the vacuum-suction nozzle. However, many connectors have irregular top surfaces, and the terminals may even project upwardly from the connector, thus preventing the direct use of vacuum-suction nozzles. With the latter type of connectors, it is known to use replaceable covers releasably mounted on the connector housing to facilitate use of a vacuum-suction nozzle, with the covers intended to be removed after the soldering reflow operation.

Problems are encountered with removable covers of the character described above. In particular, a downward force is required to mount the cover onto the connector housing, and an equal upward force is required to remove the cover from the housing after the soldering operation. "Upward" and "downward" forces are forces generally perpendicular to the printed circuit board or other electrical apparatus. Obviously, the forces required to hold the cover to the connector housing must be greater than the forces needed to prevent the cover from coming off of the housing during movement or adjustment by the vacuum-suction nozzle. After the soldering reflow operation, these significant forces are overcome to remove the cover from the housing, and these significant forces pull on the solder interfaces between the terminals and the circuit traces which could damage or break the interfaces or solder connections.

The present invention is directed to solving these problems by providing a cover which is retained on the connector housing with substantial forces in a direction normal to the printed circuit board or other electrical apparatus, but the cover is mounted to the housing and removed therefrom with minimal forces laterally of that direction.

SUMMARY OF THE INVENTION

An object, therefore, of the invention is to provide a new and improved cover for use on electrical connectors to facilitate processing the connectors with the aid of a vacuum-suction nozzle.

In the exemplary embodiment of the invention, an electrical connector is disclosed for mounting to a mounting surface of an electrical apparatus through the engagement of a vacuum-suction nozzle. The connector includes a dielectric housing having a first interface adapted to be positioned adjacent the mounting surface, a second interface opposite the first interface and wall means between the interfaces. A plurality of conductive terminals are mounted on the housing and have portions for interconnection to circuitry on the electrical apparatus. A cover is positionable on the housing over at least a portion of the second interface. The cover has a generally planar, smooth surface for engagement by the vacuum-suction nozzle.

The invention contemplates the provision of complementary interengageable releasable retention means between the cover and the wall means of the housing and adapted to retain the cover on the housing with substantial force in a direction generally normal to the smooth surface of the cover. However, the releasable retention means allow the cover to be mounted to and to be released from the housing with minimal force laterally of that normal direction.

As disclosed herein, the complementary interengageable releasable retention means are provided by slidably engageable surfaces on the cover and the housing. The sliding surfaces on the housing are on the outside of opposite side walls thereof.

Another feature of the invention is to provide stop means between the cover and the housing in the sliding direction of the cover. The stop means define a fully mounted position of the cover on the housing.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
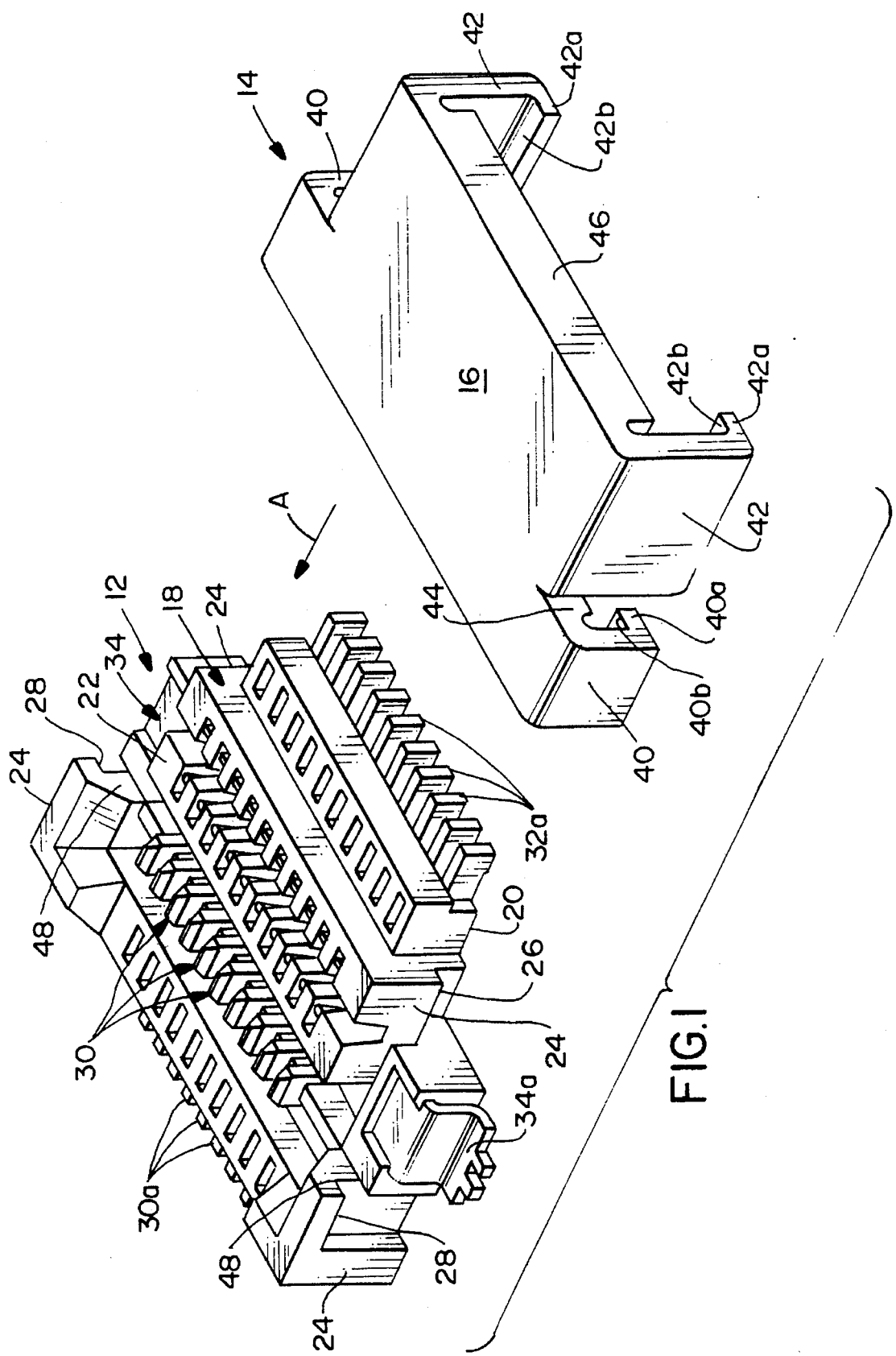
FIG. 1 is a perspective view of an electrical connector in conjunction with a cover adapted to be slidably mounted on the connector.
Figure 2:
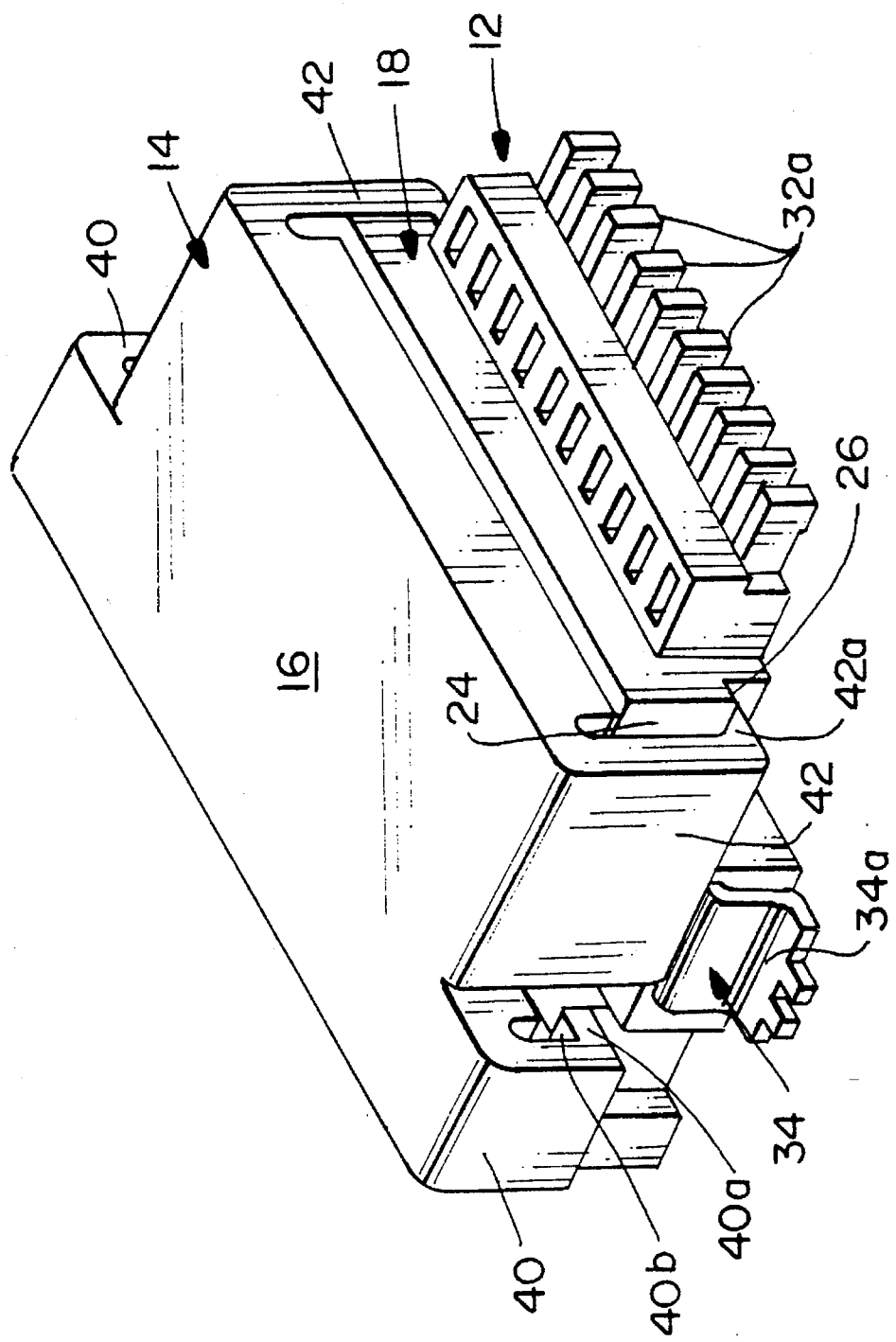
FIG. 2 is a view similar to that of FIG. 1, with the cover fully mounted on the connector.

Referring to the drawings in greater detail, and first to FIG. 1, the invention is embodied in an electrical connector, generally designated 12, for mounting to a mounting surface of an electrical apparatus, such as a printed circuit board (not shown), through the engagement of a vacuum-suction nozzle (not shown). It can be seen that the top of connector 12 is very irregular in shape and does not present any significant smooth surface for engagement by the vacuum-suction nozzle. Consequently, a cover, generally designated 14, is slidably mounted onto connector 12 in the direction of arrow "A". The cover does present a generally planar, smooth surface 16 for engagement by the vacuum-suction nozzle. FIGS. 2 and 5–7 show the cover in its fully mounted position on the connector.

Figure 4:
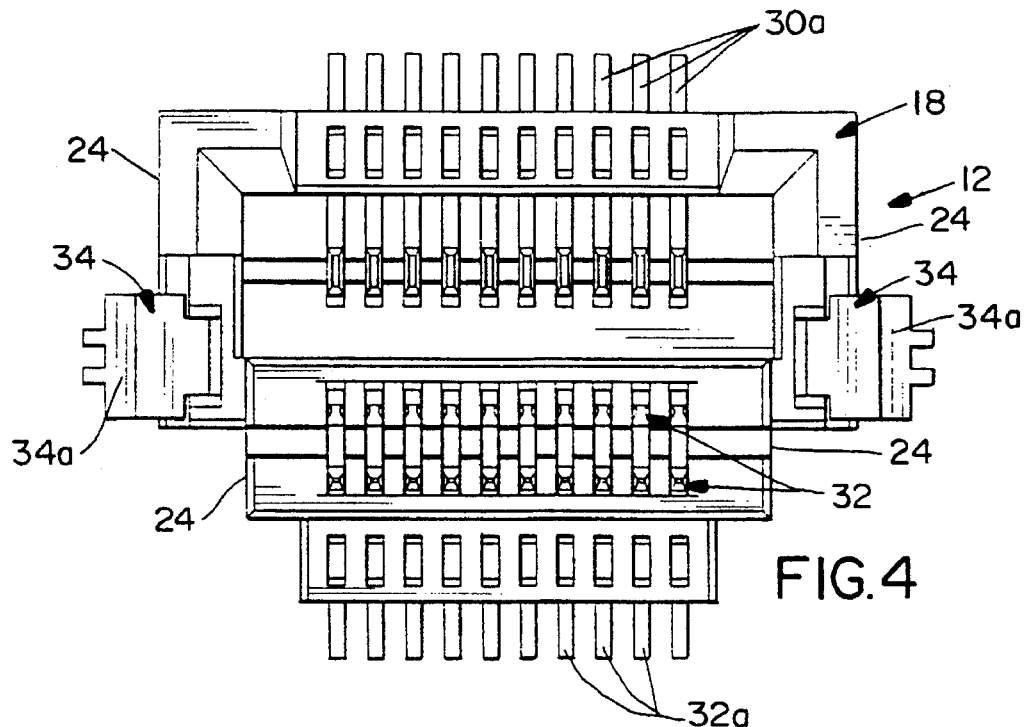
FIG. 4 is a top plan view of the connector.
Figure 3:
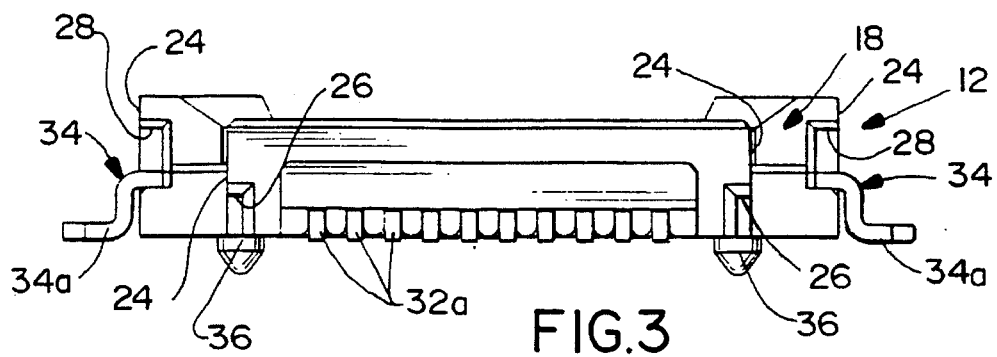
FIG. 3 is a front elevational view of the connector.
Figure 5:
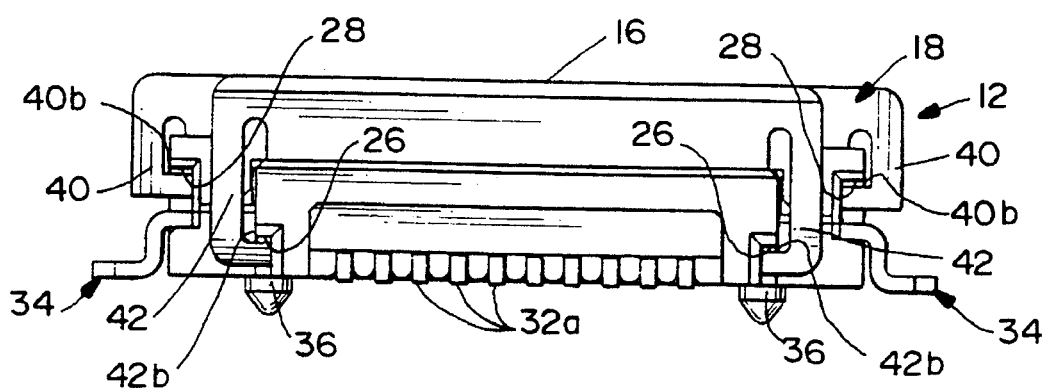
FIG. 5 is a front elevational view of the connector with the cover mounted thereon.
Figure 6:
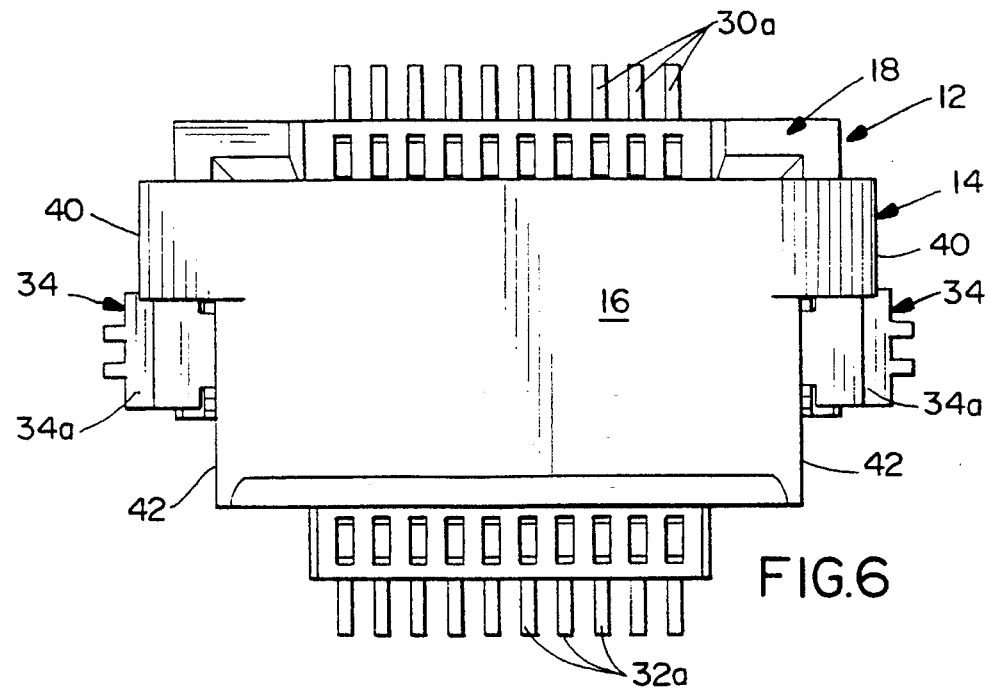
FIG. 6 is a top plan view of the connector with the cover mounted thereon.
Figure 7:
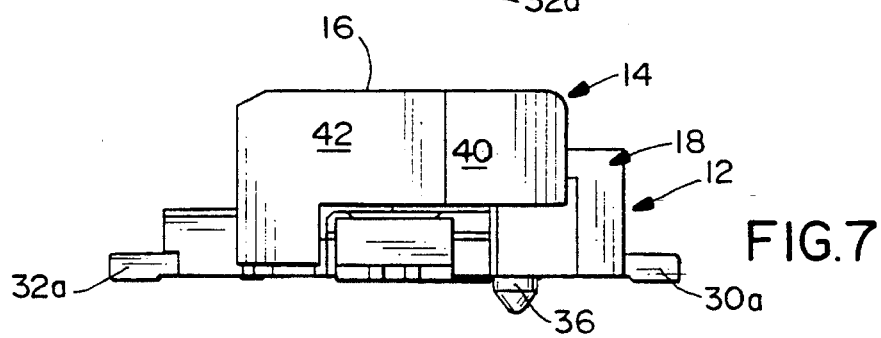
FIG. 7 is a side elevational view looking toward the right-hand side of FIG. 6.

Referring to FIGS. 3 and 4 in conjunction with FIG. 1, electrical connector 12 includes a dielectric housing, generally designated 18, which includes a first interface or bottom surface 20 adapted to be positioned adjacent the mounting surface of the electrical apparatus, such as on the top surface of a printed circuit board. Housing 18 includes a second or top interface 22 opposite bottom surface 20. A pair of side wall means 24 extend between first and second interfaces 20 and 22. The side wall means include first and second downwardly facing shoulders or surfaces 26 and 28, respectively, which facilitate slidably mounting cover 14 onto connector 12, as will be described in greater detail hereinafter.

A plurality of conductive male and female terminals, generally designated 30 and 32, respectively, are mounted in housing 18. Male terminals 30 include tail portions 30a and female terminals 32 include tail portions 32a for surface engagement with circuit traces on the printed circuit board. Tail portions 30a and 32a are adapted for soldering to the circuit traces.

Lastly, a pair of "fitting nails" 34 are mounted on side wall means 24 of connector housing 18. As is known in the art, each fitting nail includes a foot portion 34a for soldering to a solder pad on the printed circuit board. FIG. 3 shows that the feet portions 34a of fitting nails 34 are generally planar and coplanar with tail portions 32a which also are visible in FIG. 3. That depiction also shows that connector housing 18 includes a pair of downwardly projecting mounting posts 36 for positioning in a pair of appropriate mounting holes in the printed circuit board.

Figure 9:
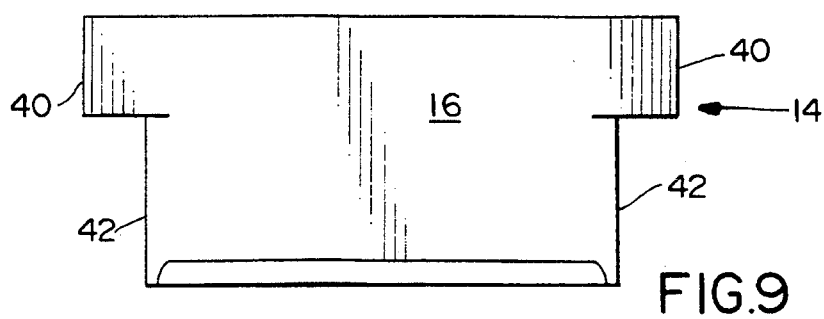
FIG. 9 is a top plan view of the cover.
Figures 8, 10:
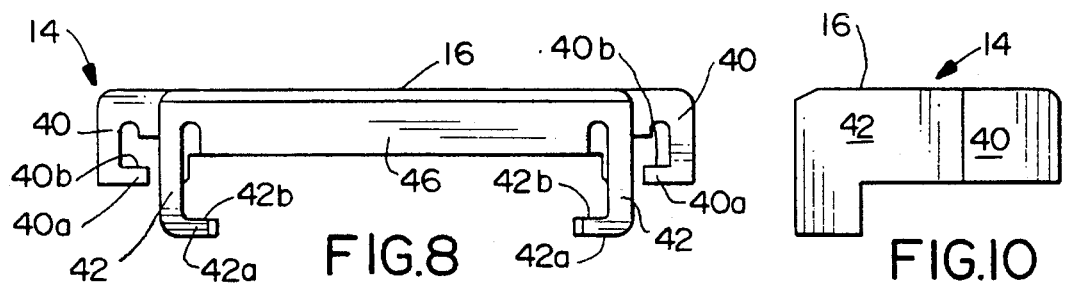
FIG. 8 is a front elevational view of the cover.
FIG. 10 is a side elevational view of the cover, looking toward the right-hand side of FIG. 8.

Referring to FIGS. 8–10 in conjunction with FIG. 1, cover 14 has a pair of forward and outer side walls 40 and a pair of rearward and inner side walls 42. "Forward" and "rearward" are meant to refer to the direction of arrow "A" (FIG. 1) which is the mounting direction of the cover onto connector 12. "Outward" and "inward" are meant to refer to the relative dispositions of side walls 40 and 42 laterally of the mounting direction. In other words, as best seen in FIG. 8, side walls 40 are located outward of side walls 42.

Side walls 40 of cover 14 have inwardly directed flanges 40a defining upwardly facing shoulders or surfaces 40b. Side walls 42 have inwardly directed flanges 42a defining upwardly facing shoulders or surfaces 42b.

Cover 16 also has forward and rearward transverse flanges 44 and 46, respectively, which depend from the top wall of the cover that defines smooth surface 16. When the cover is fully mounted on the connector, these transverse flanges prevent any solder material from contacting terminals 30 and 32. In addition, the forward transverse flange 44 is engageable with stop shoulders 48 (FIG. 1) of connector housing 18 to define a fully mounted position of the cover on the connector housing.

In operation, as stated above, cover 14 is slidably mounted onto connector housing 18 in the direction of arrow "A" (FIG. 1) until the cover reaches a fully mounted position as shown in FIGS. 2 and 5–7. The cover is mounted on the connector housing with minimal or substantially zero mounting forces as upwardly facing shoulders or surfaces 40b and 42b of the cover easily slide beneath downwardly facing shoulders 28 and 26, respectively, of the connector housing. However, when the cover is mounted on the housing, the cover can be used to manipulate the connector as upwardly facing shoulders 40b and 42b of the cover fully engage or abut against the downwardly facing shoulders 28 and 26, respectively, of the connector. In essence, these interengageable shoulders on the cover and the housing define complementary interengageable releasable retention means that retain the cover on the housing with substantial force in a direction generally normal to smooth surface 16 of the cover, but that same means allows the cover to be mounted onto and removed from the connector housing with minimal or substantially zero forces laterally of that normal direction (i.e. generally parallel to the smooth surface in the direction of arrow "A").

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. In an electrical connector for mounting to a mounting surface of a printed circuit board through the engagement of a vacuum-suction nozzle of a pick and place machine, including a dielectric housing having a first interface adapted to be positioned adjacent said mounting surface, a second interface opposite said first interface, and wall means between the interfaces;

a plurality of conductive terminals mounted on the housing, each having a portion for interconnection to circuitry on the printed circuit board; and a removable cover positionable on the housing over at least a portion of said second interface, the cover having a generally planar, smooth surface for engagement by the vacuum-suction nozzle, wherein the improvement comprises:

complementary interengageable releasable retention means between said cover and said walls of the housing and adapted to hold the cover on the housing with substantial force in a direction generally normal to said smooth surface of the cover and to hold and release the cover relative to the housing with minimal force laterally of said normal direction.

2. In an electrical connector as set forth in claim 1, wherein said complementary interengageable releasable retention means comprise slidably engageable surfaces on the cover and the housing.

3. In an electrical connector as set forth in claim 1, including complementarily engageable stop means between the cover and the housing to define a fully mounted position of the cover on the housing.

4. In an electrical connector as set forth in claim 3, wherein said complementary interengageable releasable retention means comprise slidably engageable surfaces on the cover and the housing.

5. In an electrical connector for mounting to a mounting surface of a printed circuit board through the engagement of a vacuum-suction nozzle of a pick and place machine, including a dielectric housing having a first interface adapted to be positioned adjacent said mounting surface, a second interface opposite said first interface, and outwardly directed side walls extending between the interfaces;

a plurality of conductive terminals mounted on the housing each having a portion for interconnection to circuitry on the printed circuit board; and a removable cover positionable on the housing over at least a portion of said second interface, the cover having a generally planar, smooth surface for engagement by the vacuum-suction nozzle, wherein the improvement comprises:

sliding retention means between the cover and the side walls of the housing and adapted to hold the cover on the housing with substantial force in a direction generally normal to said smooth surface of the cover while allowing the cover to be slid onto and removed from the housing with minimal force laterally of said normal direction.

6. In an electrical connector as set forth in claim 5, including complementarily engageable stop means between the cover and the housing to define a fully mounted position of the cover on the housing.

7. In an electrical connector for mounting to a mounting surface of a printed circuit board through the engagement of a vacuum-suction nozzle of a pick and place machine, including a dielectric housing having a bottom surface adapted to be positioned adjacent the mounting surface of the printed circuit board, a top surface opposite the bottom surface, and a pair of opposite, outwardly directed side wall means extending between the surfaces;

a plurality of conductive terminals mounted on the housing and having tail portions adapted for solder connection to circuit traces on the printed circuit board; and a removable cover positionable on the housing over at least a portion of said top surface, the cover having a generally planar, smooth surface for engagement by the vacuum-suction nozzle, wherein the improvement comprises:

sliding retention means between the cover and the side wall means of the housing and adapted to retain the cover on the housing with substantial force in a direction generally normal to said smooth surface of the cover while allowing the cover to be slid onto and removed from the housing with minimal force laterally of said normal direction.

8. In an electrical connector as set forth in claim 7, including complementarily engageable stop means between the cover and the housing to define a fully mounted position of the cover on the housing.

* * * * *